(12) United States Patent
Huang et al.

(10) Patent No.: US 6,555,474 B1
(45) Date of Patent: Apr. 29, 2003

(54) METHOD OF FORMING A PROTECTIVE LAYER INCLUDED IN METAL FILLED SEMICONDUCTOR FEATURES

(75) Inventors: Cheng Lin Huang, Taipei (TW); Minghsing Tsai, Taipei (TW); Winston Shue, Hsinchu (TW); Mong-Song Liang, Hsin-Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/060,820

(22) Filed: Jan. 29, 2002

(51) Int. Cl.[7] ............................................. H01L 21/44
(52) U.S. Cl. .................... 438/687; 438/533; 438/243; 438/734; 438/626; 438/674; 438/692; 438/245
(58) Field of Search ................................ 438/687, 533, 438/243, 734, 626, 674, 692, 245

(56) References Cited

U.S. PATENT DOCUMENTS

| 5,552,340 A | * | 9/1996 | Lee et al. ................ 438/533 |
| 5,591,672 A | * | 1/1997 | Lee et al. ................ 438/533 |
| 5,610,099 A | * | 3/1997 | Stevens et al. ............ 438/626 |
| 5,744,386 A | * | 4/1998 | Kenney ................... 438/245 |
| 6,100,202 A | * | 8/2000 | Lin et al. ................. 438/734 |
| 6,121,149 A | * | 9/2000 | Lukanc et al. ............ 438/692 |
| 6,156,651 A | * | 12/2000 | Havemann ............... 438/674 |
| 6,172,407 B1 | * | 1/2001 | Gardner et al. ........... 257/410 |
| 6,225,158 B1 | * | 5/2001 | Furukawa et al. ......... 438/243 |

* cited by examiner

Primary Examiner—Matthew Smith
Assistant Examiner—Victor Yevsikov
(74) Attorney, Agent, or Firm—Tung & Associates

(57) ABSTRACT

A method of forming a protective layer included in a metal filled semiconductor feature including providing a substrate including an insulating dielectric material having an anisotropically etched opening for forming a semiconductor feature; conformally depositing over the semiconductor feature at least one metal layer to substantially fill the semiconductor feature at least a portion of the at least one metal layer containing dopant impurities; and, thermally treating the substrate for a time period sufficient to redistribute the dopant impurities to preferentially collect along the periphery of the at least one metal layer.

20 Claims, 3 Drawing Sheets

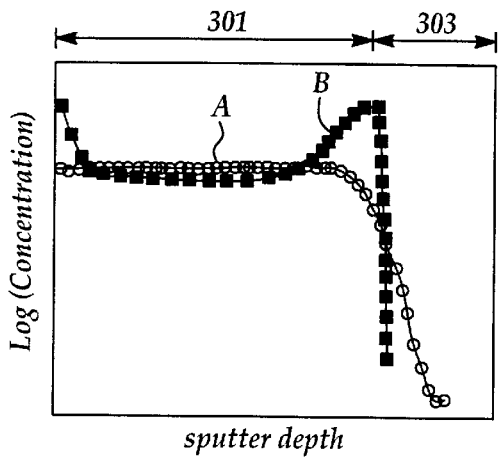
_Figure 3A_
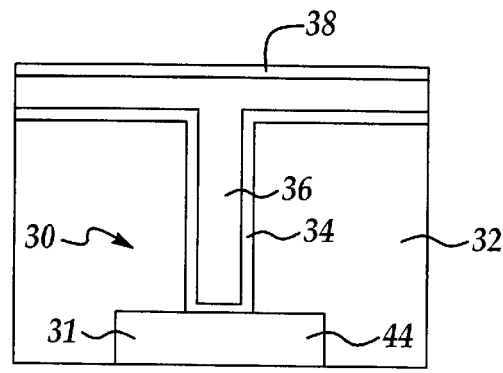
_Figure 3B_
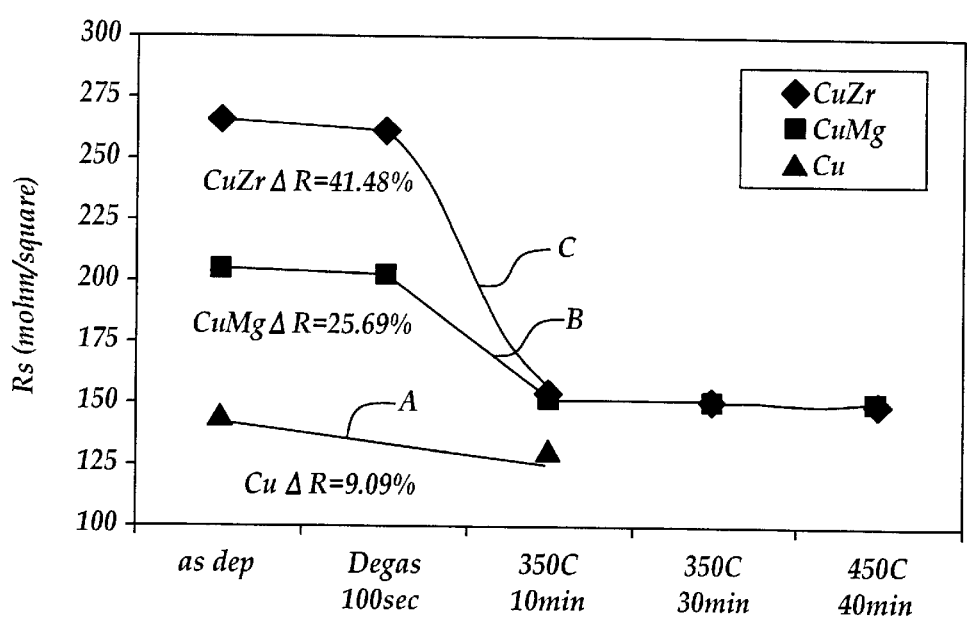
_Figure 3C_

METHOD OF FORMING A PROTECTIVE LAYER INCLUDED IN METAL FILLED SEMICONDUCTOR FEATURES

FIELD OF THE INVENTION

This invention generally relates to methods for protecting copper filled semiconductor features and more particularly to a method for producing a protective layer in metal filled semiconductor features.

BACKGROUND OF THE INVENTION

In semiconductor fabrication, various layers of insulating material, semiconducting material and conducting material are formed to produce a multilayer semiconductor device. The layers are patterned to create features that taken together, form elements such as transistors, capacitors, and resistors. These elements are then interconnected to achieve a desired electrical function, thereby producing an integrated circuit (IC) device. The formation and patterning of the various device layers may be accomplished using various fabrication techniques including oxidation, implantation, deposition, epitaxial growth of silicon, lithography, etching, and planarization.

Sub-micron multi-level metallization is one of the key technologies for the next generation of ultra large scale integration (ULSI). The multilevel interconnects that lie at the heart of this technology require planarization of interconnect features formed in high aspect ratio apertures, including contacts, vias, metal interconnect lines and other features. Reliable formation of these interconnect features is very important to the success of ULSI and to the continued effort to increase circuit density and quality on individual substrates and die.

Copper and copper alloys have become the metal of choice for filling sub-micron, high aspect ratio interconnect features on semiconductor substrates. Copper and its alloys have lower resistivity and higher electromigration resistance compared to other metals such as, for example, aluminum. These characteristics are critical for achieving higher current densities with increased device speed.

One exemplary process for forming a series of interconnected multiple layers, for example, is a damascene process. Although there are several different manufacturing methods for manufacturing damascene structures, all such methods employ a series of photolithographic masking and etching steps, typically by a reactive ion etch (RIE). In the typical multilayer semiconductor manufacturing process, for example, a series insulating layers are deposited to include a series of interconnecting metallization structures such as vias and metal line interconnects to electrically interconnect areas within the multilayer device and contact layers to interconnect the various devices on the chip surface. In most devices, pluralities of vias are separated from one another along the semiconductor wafer and selectively interconnect conductive regions between layers of a multi layer device. Metal interconnect lines typically serve to selectively interconnect conductive regions within a layer of a multilayer device. Vias and metal interconnect lines are selectively interconnected in order to form the necessary electrical connections.

FIG. 1, for example, shows a typical dual damascene structure having a metal filled feature 12, for example a via, overlying a conductive area 14, for example a trench line interconnect. In forming a damascene structure, via openings and trench line openings are etched into one or more insulating layers, e.g., 16 (referred to as IMD or ILD layers) and are back-filled with metal, for example copper. The IMD layers are preferably a low-k (low dielectric constant) insulating material which reduces signal delay times caused by parasitic capacitances. The process by which via openings (holes) and trench lines are selectively etched into the insulating layers is typically a photolithographic masking process, followed by a reactive ion etch (RIE) process, both of which are commonly known in the art.

Prior to filling the via opening with metal, a barrier layer 18, for example, tantalum nitride is deposited to cover the sidewalls and bottom of the feature such as a via opening to prevent, for example, copper diffusion into the low-k IMD layer 16 and to improve the adhesion of the copper filled feature. Although several different types of metal may be used, for example, copper, tungsten, and aluminum, copper metal, or alloys thereof are increasingly the metal of choice due to low resistivity. Typically a relatively pure (undoped) copper material is deposited to fill the via opening to form copper filled via 12. Copper may be deposited in several ways including physical vapor deposition methods or electroplating deposition methods. Electroplating is a preferable method to achieve superior step coverage of sub-micron etched features. The method generally includes depositing a metal seed layer, preferably copper, over the barrier layer, and then electroplating a metal, again preferably copper, over the seed layer to fill the etched feature to form, for example, vias and trench lines. A seed layer is required to carry electrical current for electroplating, the seed layer preferably being continuous to provide for uniform deposition. The deposited layers and the dielectric layers are then planarized, for example, by chemical mechanical polishing (CMP), to define a conductive interconnect feature, for example, via 12.

Since copper is easily oxidized when exposed to moisture or oxygen containing ambient, typically a cap (protective layer) layer, e.g., 20 of silicon carbide (SiC) or silicon nitride (SiN) which additionally functions as an etching stop layer is formed over the metal filled feature e.g., via 12 and the IMD layer 16. The etching stop layer 20 is formed following a CMP process to planarize the IMD surface 16 and to remove excess metal remaining from the electroplating process. Following deposition of the etching stop layer, another IMD layer, e.g., 22 may be deposited to repeat the feature formation process to form a multi-layer semiconductor device.

Problems with the prior art damascene manufacturing process include the fact that the etching stop (protective cap) layer undesirably adds to the overall capacitance of the multilayer semiconductor device thereby contributing to signal delay times. Another problem is that the etching stop layer contributes to reduced adhesion strength between the multiple layers potentially resulting in interlayer dielectric peeling when subjected to stresses such as those induced by CMP polishing. Further, the etching stop layer, for example, a metal nitride, is believed to contribute to photoresist poisoning effects where nitrogen containing species absorbed into the IMD layer interfere with subsequent photoresist development processes.

These and other shortcomings demonstrate a need in the semiconductor processing art to develop a method for forming multiple layer devices where the advantages of a protective cap layer may be realized without the concomitant shortcomings of reduced interlayer adhesion strength, increased capacitance, and photoresist poisoning effects.

It is therefore an object of the invention to provide a method for forming multiple layer devices where the advantages of a protective cap layer may be realized without the concomitant shortcomings reduced interlayer adhesion strength, increased capacitance, and photoresist poisoning effects.

SUMMARY OF THE INVENTION

To achieve the foregoing and other objects, and in accordance with the purposes of the present invention, as embodied and broadly described herein, the present invention provides a method of forming a protective layer included in a metal filled semiconductor feature.

In a first embodiment according to the present invention, the method includes providing a substrate including an insulating dielectric material having an anisotropically etched opening for forming a semiconductor feature; conformally depositing over the semiconductor feature at least one metal layer to substantially fill the semiconductor feature at least a portion of the at least one metal layer containing dopant impurities; and, thermally treating the substrate for a time period sufficient to redistribute the dopant impurities to preferentially collect along the periphery of the at least one metal layer.

In related embodiments, the at least a portion includes a seed layer. Further, the seed layer is deposited according to a physical vapor deposition process. Further yet, the at least a portion includes an undoped metal portion electroplated over the seed layer.

In another embodiment, the method further includes the step of planarizing the substrate following step of conformally depositing to include partially removing the at least one metal layer to form an exposed surface. Further, the step of thermally treating is at least partially carried out in an oxidizing atmosphere to form a protective layer of dopant impurity containing oxidized material at the exposed surface. Further yet, the protective layer is formed at a thickness of between about 50 Angstroms and 500 Angstroms. Yet further, the method further includes the step of forming a dielectric insulating layer over the substrate to contact the protective layer.

In related embodiments the dopant impurities include at least one of titanium, zirconium, magnesium, and carbon. Further, the dopant impurities are present in an amount ranging between about 0.1 and about 10 weight percent. Further yet, the dopant impurities are present in an amount ranging between about 0.5 and about 5 weight percent.

In other related embodiments, the at least a portion includes an electroplated layer. Further, the at least one metal layer includes at least one of copper, tungsten, and aluminum.

In yet another embodiment, the at least one metal layer is deposited over a barrier layer. Further, the barrier layer is includes a metal nitride. Further yet, the metal nitride includes tantalum nitride.

In yet another embodiment, the at least one metal layer is deposited over the insulating dielectric material included in the substrate. Further, the method further includes the step of forming a dielectric insulating layer over the substrate following a planarization step and an oxidizing thermal treatment step to form a protective layer of oxidized dopant impurities at an exposed surface of the at least one metal layer.

In yet other related embodiments, the step of thermally treating is carried out over a temperature range of between about 250° C. and about 450° C. Further, the step of thermally treating is carried out for a period of time such that the measured resistivity of the at least one metal layer is within a range of about 25% of the value of undoped metal.

These and other embodiments, aspects and features of the invention will be better understood from a detailed description of the preferred embodiments of the invention which are further described below in conjunction with the accompanying Figures.

BRIEF DESCRIPTION OF THE DRAWINGS

FIG. 3A is a representative SIMS measurement of dopant redistribution according to the present invention.

FIG. 3B is a cross sectional representation of various portions of a metal-filled semiconductor feature where doping can occur according to various embodiments of the present invention.

FIG. 3C is resistivity versus annealing treatment data for various dopants and thermal treatments according to various embodiments of the present invention.

DETAILED DESCRIPTION OF THE PREFERRED EMBODIMENTS

Although the method of the present invention is explained with reference to damascene structures including copper filled vias and trench lines it will be understood that the method of the present invention is applicable to any metal filled feature formed in a semiconductor dielectric material where metal dopants may advantageously be added to prevent oxidation of a metal used for filling semiconductor features including copper, aluminum, and tungsten, and thereby eliminating the necessity of a barrier layer and an etching stop (protective) layer.

It has been found that doping metal, for example copper with an appropriate level of dopant, minimizes metal oxidation thereby reducing the corrosive effects of metal oxidation in semiconductor features, for example, metal interconnects, when performed according to the present invention thereby eliminating the need for forming a separate protective capping layer over the metal filled feature following, for example a CMP process. According to the present invention, it has been found that an appropriate level and type of dopant added to metal, for example, copper together with a thermal treatment allows a multi-layer semiconductor device to be manufactured to form barrierless and capless metal filled interconnects.

Figure 1:
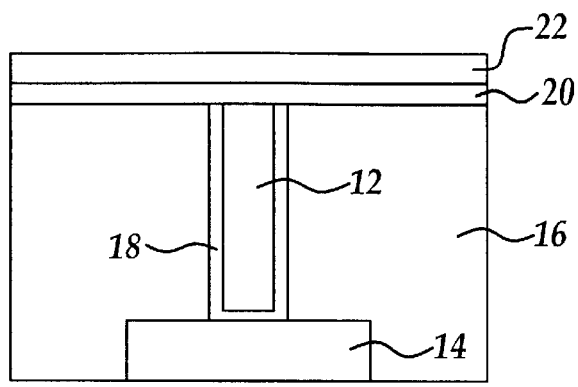
FIG. 1 is a cross-sectional representation of a portion of a multi-layer semiconductor device formed according to the prior art.
Figure 2A:
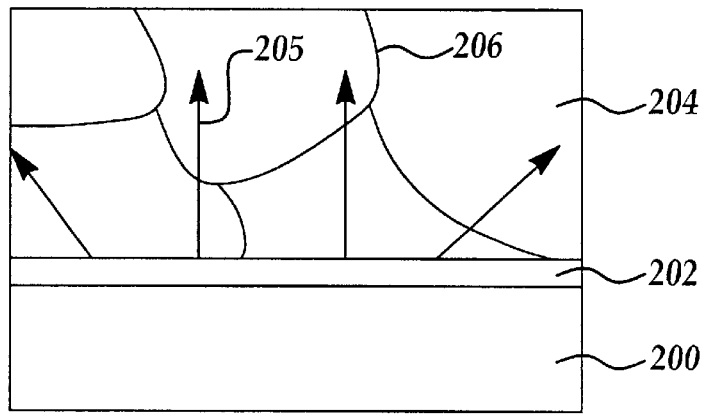
FIGS. 2A and 2B are conceptual cross-sectional views of a process of redistribution of impurity dopants according to one embodiment of the present invention.
Figure 2B:
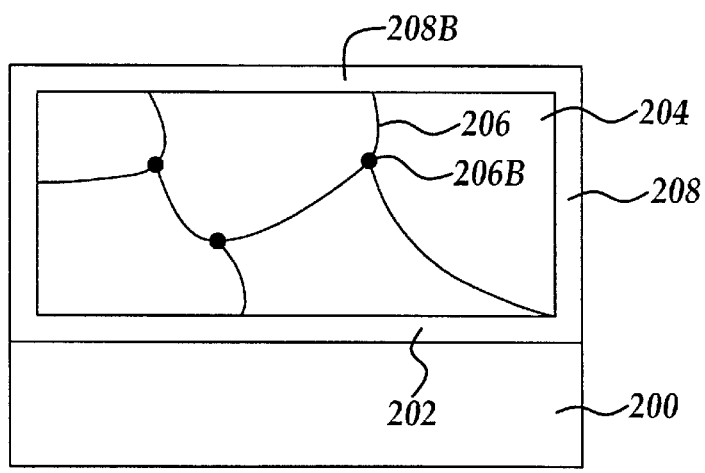

Referring to FIGS. 2A and 2B is shown conceptual diagrams of the effect of thermal treatment (annealing) according to the present invention on a doped metal layer, for example, a copper seed layer. FIG. 2A shows copper doped seed layer 202 overlying substrate 200, for example, a barrierless low-k dielectric material, deposited at temperatures less than about 200° C. according to the present invention. Overlying copper doped seed layer 202 is an undoped copper area 204 having grain boundaries e.g., 206. Upon annealing at an elevated temperature according to the present invention, copper dopant are redistributed along the periphery including interfaces e.g., 208 of the copper area 204 to form an interfacial copper doped layer 208 along the periphery to include the seed layer 202 as shown in FIG. 2B. During the thermal treatment (annealing) the dopant impurities diffuse, as generally indicated by directional arrows, e.g., 205 in FIG. 2A through the undoped copper, including along the copper grain boundaries, e.g., 206 and accumulate at material interfaces or boundaries, e.g., 208 as shown in FIG. 2B. If an oxidizing atmosphere is present during the thermal treatment, an oxide layer of material including copper alloy oxides e.g., ($Cu_xM_yO_z$) where M is a dopant and x, y, and z, are variable stoichiometric proportions, are formed at the ambient/copper interface 208B. The oxide layer including the copper alloy oxides formed at the copper/ambient interface acts as an oxidation barrier to minimize further oxidation of undoped copper. Furthermore, the dopant impurities accumulated at material interfaces 208 and along grain boundaries e.g., 206 include species of the type $Cu_xM_y$ forming at e.g., 206B that tend slow the diffusion of other species such as oxygen and copper along grain boundaries and through the material interfaces. As a result, a barrier including copper doped impurities forms at copper interfaces performing the functions performed according to the prior art by barrier layers and by capping layers.

Preferably, according to the present invention the doped metal layer is positioned as a thin layer of doped metal adjacent to a barrier layer or ILD layer, for example a seed layer, although the advantageous redistribution of the dopant impurities along the metal filled periphery may be performed by including dopant impurities in any portion of the metal layer. Referring to FIG. 3A, is shown a representative redistribution of Zr in copper according to a SIMS (Secondary Ion Mass Spectroscopy) measurement. For example, according to the SIMS method, material is sputtered from a surface, detected, and counted to produce a concentration (vertical axis) versus depth (horizontal axis) measurement. In FIG. 3A, the line A represents concentration versus depth of a Zr-doped copper layer deposited at about 20° C. Line B represents a Zr-doped copper layer after annealing at about 20° C. Area 301 represents the Zr-doped copper layer and area 303 an underlying $SiO_2$ material. The redistribution of the impurity dopants to material interfaces is thus evident from FIG. 3A.

Referring to FIG. 3B, is shown a cross sectional view of a copper filled feature 30 overlying a conductive area 31 formed within an insulating dielectric layer 32 to include a seed layer 34, a copper plating layer 36, for example a bonding pad, and a capping layer 38.

While doping any of the areas 34, 36, and 38 with dopant impurities and allowing a sufficient annealing time at a proper annealing temperature, tends to redistribute dopant impurities to material interfaces including the periphery of the metal layer, doping of the seed layer 34 is preferred for several reasons. A metal seed layer, for example, a copper seed layer is typically deposited according to a physical vapor deposition (PVD) process preferably followed by an electroplating process to deposit copper over the copper seed layer to fill a semiconductor feature, for example, a via, or trench line. Typically the seed layer is deposited over a barrier layer, for example, tantalum nitride (TaN). The seed layer according to the present invention is preferably doped with impurities for several considerations including the ease of providing a deposition target with appropriate dopant concentrations and the high degree of control over the doping concentration of the seed layer according to PVD. Another consideration making seed layer doping preferable is that the diffusion path length is reduced thereby allowing thermal treatments over shorter periods of time to accomplish dopant redistribution to the periphery (material interfaces) of the semiconductor feature. Another advantage of seed layer doping is that dopant impurities, for example the metallic dopants of the present invention tend to improve the wettability of metal, for example copper, on barrier layers such as metal nitride, thereby preferentially forming continuous films at low coverages and improving subsequent electroplating processes. Of course, the improved wettability of copper on a metal nitride barrier layer, for example, TaN is advantageous only in the event a barrier layer is present.

In one embodiment of the present invention, the formation of a metal doped layer at a material interface, for example, along the periphery of semiconductor feature, obviates the need of a barrier layer thereby allowing the formation of a barrierless metal-filled semiconductor feature where the metal seed layer is deposited directly over the ILD layer. In another embodiment, the formation of a metal doped layer at a material interface according to the thermal treatment of the present invention forms a metal doped oxide at the upper surface of the copper filled feature thereby forming a barrier layer or protective capping layer over the exposed surface of the metal filled feature.

Figure 4A:
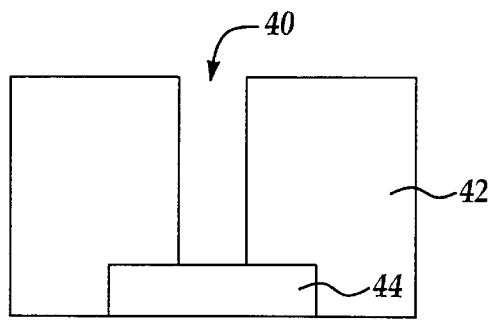
FIGS. 4A through 4F are cross sectional views of stages in an exemplary manufacturing process according to one embodiment of the present invention.

For example, referring to FIG. 4A is shown a cross sectional views of a portion of a semiconductor device showing via opening 40 formed in insulating layer (interlayer dielectric (ILD) layer) 42 overlying and in electrical communication with conductive area 44.

The ILD layer 42 is typically a low-k (low dielectric constant material) including, for example, carbon or fluorine doped oxide, porous organic or inorganic materials, or organic materials such as polyimides and parylenes. The ILD layer 42 is typically formed with a thickness range between of about 3000 to 8000 Angstroms by a variety of deposition methods including chemical vapor deposition (CVD), plasma enhanced CVD (PECVD), and spin coating methods. After forming the ILD layer 42 a semiconductor feature, for example, via opening 40 is then anisotropically etched into the ILD layer 42 according to a conventional reactive ion etch (RIE) process.

Figure 4B:
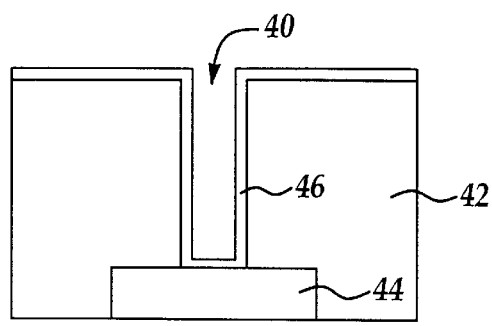

According to one embodiment of the present invention, a doped copper seed layer 46 is blanket (conformally) deposited over a semiconductor feature, for example, via opening 40 to cover the sidewalls and bottom portion as shown in FIG. 4B to form a cathode for a copper electroplating process. Preferably, the doped copper seed layer 46 is deposited according to a physical vapor deposition process (PVD) using a target with the appropriate level of one or more dopant impurities contained therein. Other methods of forming the metal (copper) seed layer, of course, may be used according to the present invention, including for example, CVD methods. The doped copper seed layer is preferably deposited to a thickness of between about 25 and 150 Angstroms. According to the present invention, preferable dopants include titanium (Ti), zirconium (Zr), magnesium (Mg), carbon (C), and combinations thereof. The dopant levels according to the present invention are preferably between about 0.1 and about 10 weight percent, more preferably, between about 0.5 and about 5 weight percent.

Figure 4C:
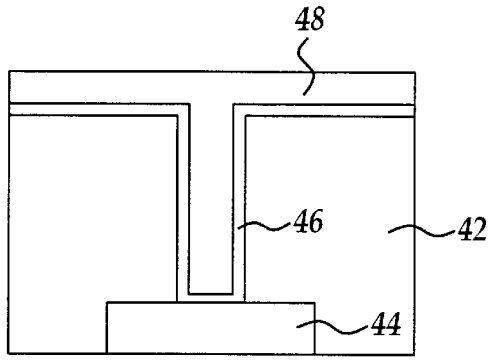
Figure 4D:
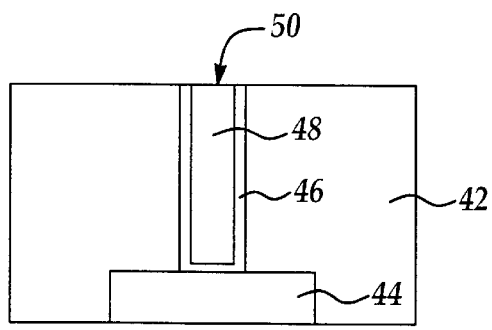

Following deposition of the doped copper seed layer according to one embodiment of the present invention, a conventional electroplating process is performed to deposit an electroplated copper layer 48 over the copper seed layer 46 as shown in FIG. 4C to substantially fill the via opening 40 and forming an overlayer of copper, e.g., 48. A planarization process, preferably a conventional CMP process then follows to planarize the substrate, e.g., ILD layer 42 to include removing any excess copper remaining from the electroplating and seed layer formation process from the semiconductor process wafer to form exposed surface 50 as shown in FIG. 4D.

Figure 4E:
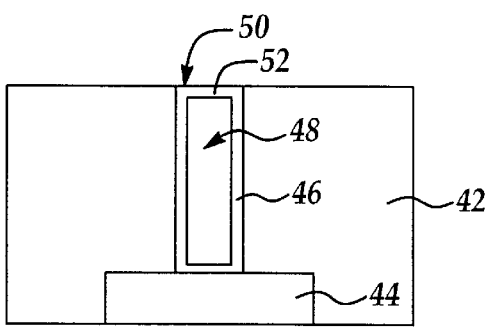
Figure 4F:
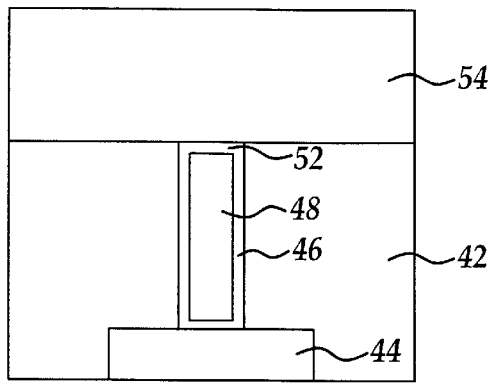

Following planarization, according to one embodiment of the present invention, the copper filled feature, e.g., 48 is subjected to a thermal treatment preferably between about 250° C. and about 450° C. In one embodiment, at least a portion of the thermal treatment is performed in an oxidizing environment to form an oxidized protective layer of dopant containing metal 52 adjacent the exposed surface 50 at the upper portion of the metal filled feature as shown in FIG. 4E. The formation of the protective layer 52 according to the present invention forms a protective layer over the metal filled feature allowing a capless multilayer semiconductor device to be formed as shown in FIG. 4F by depositing a subsequent IMD layer 54 directly over ILD layer 42 to contact both the ILD layer and the protective layer.

It will be appreciated that the period of time for thermal treatment will in part depend on the diffusion rates of the dopants through the metal filled feature to substantially redistribute the dopants along the periphery of the metal filled feature, e.g., 46, 52. Further, the period of thermal treatment necessary to form the doped metal oxide protective layer 52 may depend on the diffusion rate oxygen into the doped metal and therefore the temperature. Preferably, the thermal treatment is at a temperature for a period of time sufficient to redistribute the dopants such that the dopant concentration at the material interfaces is preferably between about 0.1 and about 10 weight percent, more preferably, between about 0.5 and about 5 weight percent. Further, preferably at least a portion of thermal treatment is at a temperature for a period of time to form a doped metal oxide protective layer at the upper portion (exposed surface) of the metal filled feature preferably having a thickness of between about 50 and about 500 Angstroms.

For example, referring to FIG. 3C, is shown the effect of resistivity (vertical axis) on the thermal treatment (horizontal axis) of copper and doped copper alloys (doped at about 5 weight percent) formed at about 20° C. by PVD. Substantially pure copper (undoped) shows essentially no change in resistivity upon thermal treatment as indicated by line A. Copper doped with Mg to form a CuMg alloy, drops in resistivity about 26 percent, as shown by line B upon annealing at 350° C. for periods of time greater than about 10 minutes. Copper doped with Zr to form a CuZr alloy, drops in resistivity about 42 percent, as shown by line C upon annealing at 350° C. for periods of time greater than about 10 minutes. The foregoing results demonstrate that the doping levels are effectively redistributed after a thermal annealing treatment for about 10 minutes at about 350° C. In addition, the results demonstrate the bulk resistivity of the doped copper alloys is about that of the undoped copper, or within at least about 25% of the value of the undoped copper, thereby preserving the low resistivity benefit of undoped copper.

Therefore, a method has been presented according to the present invention for forming multiple layer semiconductor devices whereby the advantages of a protective cap layer may be realized without the concomitant shortcomings of reduced interlayer adhesion strength, increased capacitance, and photoresist poisoning effects.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method of forming a protective layer included in a metal filled semiconductor feature comprising the steps of:
providing a substrate including an insulating dielectric material having an anisotropically etched opening for forming a semiconductor feature;
conformally depositing over the semiconductor feature at least one metal layer to substantially fill the semiconductor feature at least a portion of the at least one metal layer containing dopant impurities; and
thermally treating the substrate for a time period sufficient to redistribute the dopant impurities to preferentially collect along the periphery of the at least one metal layer.

2. The method of claim 1, wherein the at least a portion includes a seed layer.

3. The method of claim 2, wherein the seed layer is deposited according to a physical vapor deposition process.

4. The method of claim 2, wherein the at least a portion includes an undoped metal portion electroplated over the seed layer.

5. The method of claim 1, further comprising the step of planarizing the substrate following step of conformally depositing to include partially removing the at least one metal layer to form an exposed surface.

6. The method of claim 5, wherein the step of thermally treating is at least partially carried out in an oxidizing atmosphere to form a protective layer of dopant impurity containing oxidized material at the exposed surface.

7. The method of claim 6, wherein the protective layer is formed at a thickness of between about 50 Angstroms and 500 Angstroms.

8. The method of claim 6 further comprising the step of forming a dielectric insulating layer over the substrate to contact the protective layer.

9. The method of claim 1, wherein the dopant impurities include at least one of titanium, zirconium, magnesium, and carbon.

10. The method of claim 9, wherein the dopant impurities are present in an amount ranging between about 0.1 and about 10 weight percent.

11. The method of claim 9, wherein the dopant impurities are present in an amount ranging between about 0.5 and about 5 weight percent.

12. The method of claim 1, wherein the at least a portion includes an electroplated layer.

13. The method of claim 1, wherein the at least one metal layer includes at least one of copper, tungsten, and aluminum.

14. The method of claim 1, wherein the at least one metal layer is deposited over a barrier layer.

15. The method of claim 14, wherein the barrier layer is includes a metal nitride.

16. The method of claim 15, wherein the metal nitride includes tantalum nitride.

17. The method of claim 1, wherein the at least one metal layer is deposited over the insulating dielectric material included in the substrate.

18. The method of claim 17 further comprising the step of forming a dielectric insulating layer over the substrate following a planarization step and an oxidizing thermal treatment step to form a protective layer of oxidized dopant impurities at an exposed surface of the at least one metal layer.

19. The method of claim 1, wherein the step of thermally treating is carried out over a temperature range of between about 250° C. and about 450° C.

20. The method of claim 1, wherein the step of thermally treating is carried out for a period of time such that the measured resistivity of the at least one metal layer is within a range of about 25% of the value of undoped metal.

* * * * *